(12) United States Patent  (10) Patent No.: US 7,397,533 B2
Verhagen et al.  (45) Date of Patent: Jul. 8, 2008

(54) LITHOGRAPHIC APPARATUS AND DEVICE MANUFACTURING METHOD

(75) Inventors: Martinus Cornelis Maria Verhagen, Valkenswaard (NL); Hans Jansen, Eindhoven (NL); Marco Koert Stavenga, Eindhoven (NL); Jacobus Johannus Leonardus Hendricus Verspay, Thorn (NL)

(73) Assignee: ASML Netherlands B.V., Veldhoven (NL)

( * ) Notice: Subject to any disclaimer, the term of this patent is extended or adjusted under 35 U.S.C. 154(b) by 224 days.

(21) Appl. No.: 11/005,221

(22) Filed: Dec. 7, 2004

(65) Prior Publication Data

US 2006/0119809 A1   Jun. 8, 2006

(51) Int. Cl.
G03B 27/42 (2006.01)
G03B 27/52 (2006.01)

(52) U.S. Cl. .......................................... 355/53; 355/30
(58) Field of Classification Search .................... 355/53, 355/67, 72–76, 30, 55; 250/548
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,528,118 A | 6/1996 | Lee | |
| 5,610,683 A | 3/1997 | Takahashi | 355/53 |
| 5,623,853 A | 4/1997 | Novak et al. | |
| 5,715,039 A | 2/1998 | Fukuda et al. | 355/53 |
| 5,825,043 A | 10/1998 | Suwa | 250/548 |
| 5,874,820 A | 2/1999 | Lee | |
| 5,900,354 A | 5/1999 | Batchelder | 430/395 |
| 5,969,441 A | 10/1999 | Loopstra et al. | |
| 6,191,429 B1 | 2/2001 | Suwa | 250/548 |

(Continued)

FOREIGN PATENT DOCUMENTS

DE    DD 206 607    2/1984

(Continued)

OTHER PUBLICATIONS

English Translation of PCT Patent Application Publication No. WO 2004/086470 (dated Nov. 26, 2007).*

(Continued)

*Primary Examiner*—Henry Hung Nguyen
(74) *Attorney, Agent, or Firm*—Pillsbury Winthrop Shaw Pittman, LLP (57) ABSTRACT

A lithographic apparatus is disclosed wherein a liquid supply system is configured to at least partly fill a region between a substrate and a projection system of the lithographic apparatus with a liquid and having a liquid confinement structure fixed in a plane substantially perpendicular to an optical axis of the projection system and configured to cooperate with a substrate table configured to hold the substrate in order to restrict the liquid to a region above an upper surface of the substrate table so that a side of the substrate to be exposed is substantially covered in the liquid during exposure.

32 Claims, 6 Drawing Sheets

U.S. PATENT DOCUMENTS

| | | |
|---|---|---|
| 6,236,634 B1 | 5/2001 | Lee et al. .................... 369/112 |
| 6,560,032 B2 | 5/2003 | Hatano ....................... 359/656 |
| 6,600,547 B2 | 7/2003 | Watson et al. |
| 6,603,130 B1 | 8/2003 | Bisschops et al. ......... 250/492.1 |
| 6,633,365 B2 | 10/2003 | Suenaga ...................... 355/53 |
| 2002/0020821 A1 | 2/2002 | Van Santen et al. ......... 250/492 |
| 2002/0163629 A1 | 11/2002 | Switkes et al. ................ 355/53 |
| 2003/0030916 A1 | 2/2003 | Suenaga |
| 2003/0123040 A1 | 7/2003 | Almogy ....................... 355/69 |
| 2003/0174408 A1 | 9/2003 | Rostalski et al. ............ 359/642 |
| 2004/0000627 A1 | 1/2004 | Schuster |
| 2004/0021844 A1 | 2/2004 | Suenaga |
| 2004/0075895 A1 | 4/2004 | Lin ............................ 359/380 |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. .......... 355/30 |
| 2004/0125351 A1 | 7/2004 | Krautschik et al. ............ 355/53 |
| 2004/0135099 A1 | 7/2004 | Simon et al. |
| 2004/0136494 A1 | 7/2004 | Lof et al. |
| 2004/0160582 A1 | 8/2004 | De Smit et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1* | 10/2004 | Derksen et al. .......... 250/492.1 |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0239954 A1 | 12/2004 | Bischoff ..................... 356/635 |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano ....................... 355/30 |
| 2005/0007569 A1 | 1/2005 | Streefkerk et al. ............. 355/30 |
| 2005/0018155 A1 | 1/2005 | Cox et al. ..................... 355/30 |
| 2005/0024609 A1 | 2/2005 | De Smit et al. ................ 355/18 |
| 2005/0030497 A1 | 2/2005 | Nakamura .................... 355/30 |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046813 A1 | 3/2005 | Streefkerk et al. ............. 355/30 |
| 2005/0046934 A1 | 3/2005 | Ho et al. ..................... 359/380 |
| 2005/0048223 A1 | 3/2005 | Pawloski et al. |
| 2005/0052632 A1 | 3/2005 | Miyajima .................... 355/53 |
| 2005/0068499 A1 | 3/2005 | Dodoc et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094125 A1 | 5/2005 | Arai ............................ 355/72 |
| 2005/0100745 A1 | 5/2005 | Lin et al. |
| 2005/0117224 A1 | 6/2005 | Shafer et al. |
| 2005/0122497 A1 | 6/2005 | Lyons et al. |
| 2005/0122505 A1 | 6/2005 | Miyajima .................... 355/72 |
| 2005/0134817 A1 | 6/2005 | Nakamura .................... 355/53 |
| 2005/0140948 A1 | 6/2005 | Tokita ......................... 355/30 |
| 2005/0141098 A1 | 6/2005 | Schuster |
| 2005/0145803 A1 | 7/2005 | Hakey et al. |
| 2005/0146693 A1 | 7/2005 | Ohsaki ........................ 355/30 |
| 2005/0146694 A1 | 7/2005 | Tokita ......................... 355/30 |
| 2005/0146695 A1 | 7/2005 | Kawakami |
| 2005/0147920 A1 | 7/2005 | Lin et al. |
| 2005/0151942 A1 | 7/2005 | Kawashima .................. 355/30 |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0200815 A1 | 9/2005 | Akamatsu ..................... 353/53 |
| 2005/0205108 A1 | 9/2005 | Chang et al. |
| 2005/0213065 A1 | 9/2005 | Kitaoka ....................... 355/53 |
| 2005/0213066 A1 | 9/2005 | Sumiyoshi ................... 355/53 |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219489 A1 | 10/2005 | Nei et al. ..................... 355/53 |
| 2005/0225737 A1 | 10/2005 | Weissenrieder et al. |
| 2005/0233081 A1 | 10/2005 | Tokita ........................ 427/256 |
| 2005/0270505 A1 | 12/2005 | Smith |
| 2006/0001851 A1 | 1/2006 | Grant et al. |
| 2006/0012765 A1* | 1/2006 | Kameyama ................... 355/53 |
| 2008/0030697 A1 | 2/2008 | Kameyama |

FOREIGN PATENT DOCUMENTS

| | | | |
|---|---|---|---|
| DE | DD 221 563 | 4/1985 | |
| DE | 224448 | 7/1985 | |
| DE | 242880 | 2/1987 | |
| EP | 0023231 | 2/1981 | |
| EP | 0418427 | 3/1991 | |
| EP | 1039511 | 9/2000 | |
| FR | 2474708 | 7/1981 | |
| JP | A 57-152129 | 9/1982 | |
| JP | A 57-153433 | 9/1982 | |
| JP | 58-202448 | 11/1983 | |
| JP | A 59-19912 | 2/1984 | |
| JP | 62-065326 | 3/1987 | |
| JP | 62-121417 | 6/1987 | |
| JP | 63-157419 | 6/1988 | |
| JP | 04-305915 | 10/1992 | |
| JP | 04-305917 | 10/1992 | |
| JP | A 05-62877 | 3/1993 | |
| JP | A 6-29204 | 2/1994 | |
| JP | 06-124873 | 5/1994 | |
| JP | 07-132262 | 5/1995 | |
| JP | 07-220990 | 8/1995 | |
| JP | A 08-316125 | 11/1996 | |
| JP | A 08-330224 | 12/1996 | |
| JP | A 10-163099 | 6/1998 | |
| JP | 10-228661 | 8/1998 | |
| JP | A 10-214783 | 8/1998 | |
| JP | 10-255319 | 9/1998 | |
| JP | 10-303114 | 11/1998 | |
| JP | 10-340846 | 12/1998 | |
| JP | 11-176727 | 7/1999 | |
| JP | 2000-058436 | 2/2000 | |
| JP | 2001-091849 | 4/2001 | |
| JP | 2004-193252 | 7/2004 | |
| JP | WO/2004/086470 | * 7/2004 | ................. 355/53 |
| WO | WO 98/28665 A1 | 7/1998 | |
| WO | WO 99/49504 | 9/1999 | |
| WO | WO 02/091078 A1 | 11/2002 | |
| WO | WO 03/077036 | 9/2003 | |
| WO | WO 03/077037 | 9/2003 | |
| WO | WO 2004/019128 | 3/2004 | |
| WO | WO 2004/053596 A2 | 6/2004 | |
| WO | WO 2004/053950 A1 | 6/2004 | |
| WO | WO 2004/053951 A1 | 6/2004 | |
| WO | WO 2004/053952 A1 | 6/2004 | |
| WO | WO 2004/053953 A1 | 6/2004 | |
| WO | WO 2004/053954 A1 | 6/2004 | |
| WO | WO 2004/053955 A1 | 6/2004 | |

| | | |
|---|---|---|
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A1 | 9/2004 |
| WO | WO 2004/081666 A1 | 9/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/107048 A2 | 12/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/010611 | 2/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 | 3/2005 |
| WO | WO 2005/034174 A2 | 4/2005 |
| WO | 2005/059645 A2 | 6/2005 |
| WO | W O2005/054953 A2 | 6/2005 |
| WO | W O2005/059617 | 6/2005 |
| WO | WO 2005/050324 A2 | 6/2005 |
| WO | WO 2005/054955 A2 | 6/2005 |
| WO | WO 2005/059618 A2 | 6/2005 |
| WO | WO 2005/059654 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |

OTHER PUBLICATIONS

M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", FUTURE FAB International, vol. 15, Jul. 11, 2003.
H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.
G. Owen et al., "1/8 µm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial $\Lambda$/NA scaling equations for resolution, depth of focus, and immersion lithography, *J. Microlith., Microfab., Microsyst.* 1(1):7-12 (2002).
Information Disclosures Statement filed Jun. 8, 2007 for U.S. Appl. No. 11/808,406.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

* cited by examiner

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
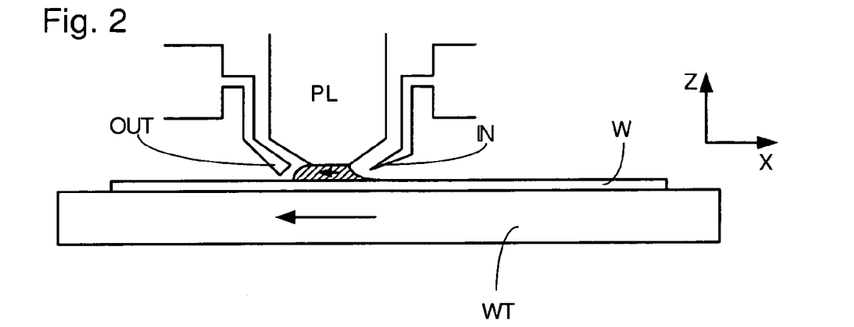
FIGS. 2 and 3 depict a liquid supply system for use in a lithographic projection apparatus.
Figure 3:
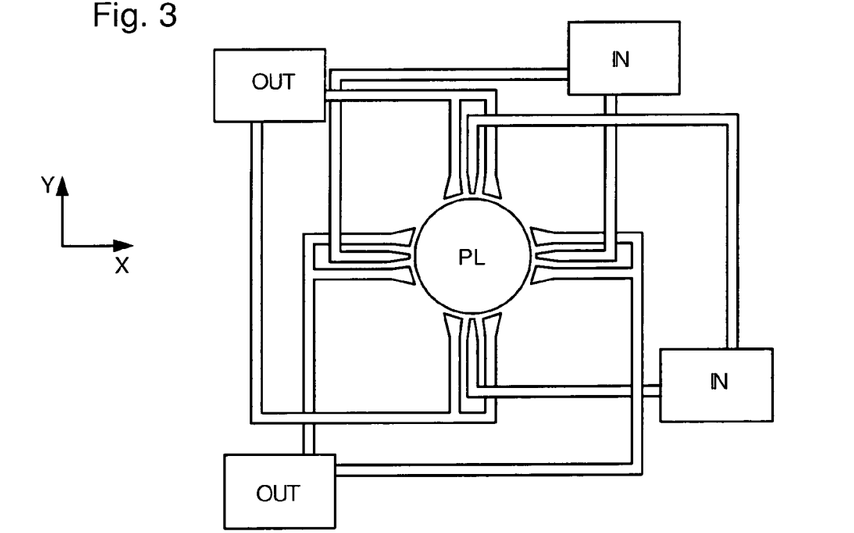

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT Patent Application No. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element.

U.S. Pat. No. 6,788,477 discloses an immersion lithography system in which the substrate is entirely covered by immersion liquid during exposure. The liquid supply system for providing the immersion liquid is provided in a "fluid-containing wafer stage", which moves relative to the projection system. The wafer stage disclosed includes a cover that helps to protect the fluid from the atmospheric environment.

SUMMARY

A possible disadvantage of an immersion lithographic system as disclosed in U.S. Pat. No. 6,788,477 is the supply of liquid to a liquid containment system that moves during exposure. For this reason, for example, an immersion lithographic system may comprise a liquid supply system that is fixed relative to the projection system, a substantially sealed volume of liquid being moved over the substrate surface during exposure. However, liquid residue may be left behind on the substrate with such a system due to, for example, a leaky seal. Evaporation of such liquid, and cooling of the substrate caused by such evaporation, may reduce the quality of the image formed on the substrate.

Accordingly, it would be advantageous, for example, to reduce the extent of imaging defects attributable to immersion liquid.

According to an embodiment of the invention, there is provided a lithographic apparatus, comprising:

a substrate table constructed to hold a substrate to be exposed;

a projection system configured to project a patterned radiation beam onto a target portion on a side of the substrate to be exposed;

a liquid supply system configured to at least partly fill a region between the substrate and the projection system with a liquid; and a liquid confinement structure fixed in a plane substantially perpendicular to an optical axis of the projection system and configured to cooperate with the substrate table in order to restrict the liquid to a region above an upper surface of the substrate table so that a side of the substrate to be exposed is substantially covered in the liquid during exposure.

According to a further aspect of the invention, there is provided a lithographic apparatus, comprising:

a projection system configured to project a patterned radiation beam onto a target portion of a substrate;

a liquid supply system configured to at least partly fill a region between the substrate and the projection system with a liquid; and a saturated gas supply system configured to provide substantially saturated gas to a surface of the substrate not covered by liquid.

According to a further aspect of the invention, there is provided a lithographic apparatus, comprising:

a substrate table configured to hold a substrate to be exposed;

a projection system configured to project a patterned radiation beam onto a target portion on a side of the substrate to be exposed;

a liquid supply system configured to at least partly fill a region between the substrate and the projection system with a liquid;

a first confinement structure fixed in a plane substantially perpendicular to an optical axis of the projection system and configured to cooperate with the substrate table in order to restrict the liquid to a region above an upper surface of the substrate table; and a second confinement structure fixed in a plane substantially perpendicular to an optical axis of the projection system and configured to cooperate with the substrate table in order to restrict substantially saturated gas to a region above an upper surface of the substrate table, wherein the first and second confinement structures and the substrate table are arranged so that a side of the substrate to be exposed is entirely covered with substantially saturated gas except for an area covered with liquid during exposure.

According to a further aspect of the invention, there is provided a lithographic apparatus, comprising:

a substrate table configured to hold a substrate to be exposed;

a projection system configured to project a patterned radiation beam onto a target portion of a substrate;

a liquid supply system configured to at least partly fill a region between the substrate and the projection system with a liquid;

a saturated gas supply system configured to provide substantially saturated gas to a surface of the substrate not covered by liquid;

a first confinement structure fixed in a plane substantially perpendicular to an optical axis of the projection system and configured to contain the liquid; and a second confinement structure fixed in a plane substantially perpendicular to an optical axis of the projection system and configured to cooperate with the substrate table in order to restrict substantially saturated gas to a region above an upper surface of the substrate table, wherein the first and second confinement structures and the substrate table are arranged so that a side of the substrate to be exposed is entirely covered with substantially saturated gas except for an area covered with liquid during exposure.

According to further aspect of the invention, there is provided a device manufacturing method, comprising:

using a liquid confinement structure, that is fixed in a plane substantially perpendicular to an optical axis of a projection system of a lithographic apparatus and arranged to cooperate with a substrate table of the lithographic apparatus holding a substrate, to restrict a liquid to a region above an upper surface of the substrate table and to maintain a side of the substrate to be exposed entirely immersed in the liquid; and projecting a patterned radiation beam through the liquid onto a target portion of the substrate using the projection system.

According to a further aspect of the invention, there is provided a device manufacturing method, comprising:

at least partly filling a region between a projection system of a lithographic apparatus and a substrate with a liquid;

providing a substantially saturated gas to a surface of the substrate not covered by liquid; and projecting a patterned radiation beam through the liquid onto a target portion of the substrate using the projection system.

According to a further aspect of the invention, there is provided a device manufacturing method, comprising:

restricting a liquid to a region above an upper surface of a substrate table of a lithographic apparatus holding a substrate using a first confinement structure that is fixed in a plane substantially perpendicular to an optical axis of a projection system of a lithographic apparatus and arranged to cooperate with the substrate table;

restricting substantially saturated gas to a region above an upper surface of the substrate table using a second confinement structure that is fixed in a plane substantially perpendicular to the optical axis and arranged to cooperate with the substrate table; and projecting a patterned radiation beam through the liquid onto a target portion of the substrate using the projection system, wherein the first and second liquid confinement structures and the substrate table are arranged so that a side of the substrate to be exposed is entirely covered with the substantially saturated gas except for an area covered in the liquid during exposure.

According to a further aspect of the invention, there is provided a device manufacturing method, comprising:

restricting a liquid to a region between a projection system of a lithographic apparatus and a substrate held on a substrate table of the lithographic apparatus using a first confinement structure that is fixed in a plane substantially perpendicular to an optical axis of the projection system;

supplying a substantially saturated gas to a surface of the substrate not covered by liquid;

restricting substantially saturated gas to a region above an upper surface of the substrate table using a second confinement structure that is fixed in a plane substantially perpendicular to the optical axis and arranged to cooperate with the substrate table; and projecting a patterned radiation beam through the liquid onto a target portion of the substrate using the projection system, wherein the first and second confinement structures and the substrate table are arranged so that a side of the substrate to be exposed is entirely covered with the substantially saturated gas except for an area covered in the liquid during exposure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
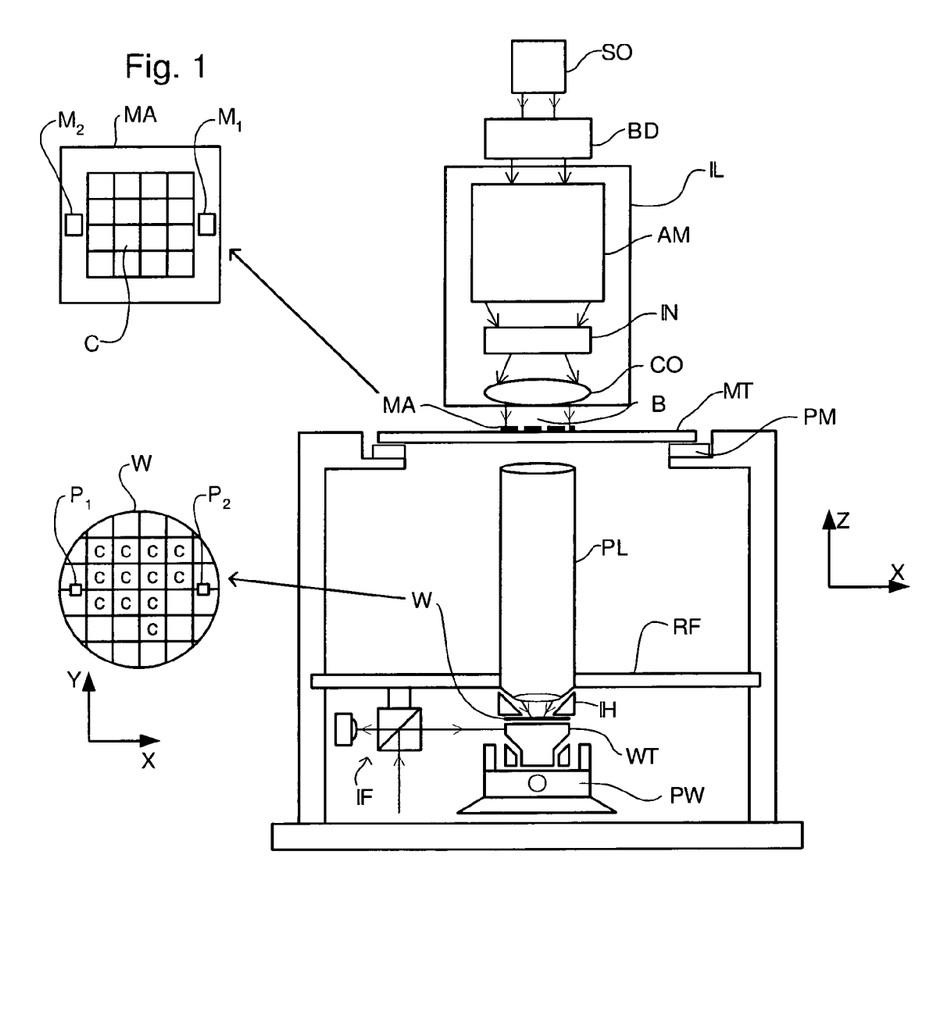
FIG. 1 depicts a lithographic apparatus according to an embodiment of the invention.

FIG. 1 schematically depicts a lithographic apparatus according to an embodiment of the invention. The apparatus comprises:
- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines, the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure MT (e.g., mask table), and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
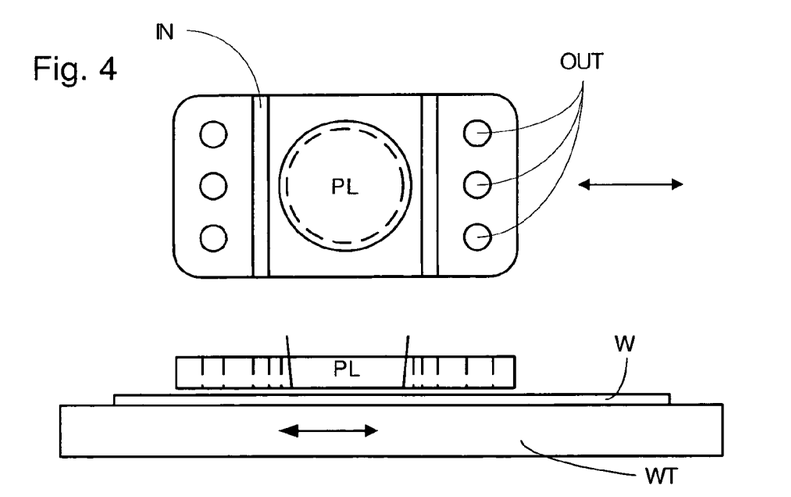
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a liquid confinement structure which extends along at least a part of a boundary of the space between the final element of the projection system and the substrate table. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

Using the localized liquid supply system having a liquid confinement structure described above as an example, the liquid confinement structure is used to contain a liquid film in a region between a portion of the substrate W to be exposed and the projection system PL. After exposure of a particular target region or "die" on the substrate, the substrate table WT is moved relative to the projection system PL and a portion of the substrate W that was previously immersed in immersion liquid is exposed to the atmosphere around the liquid confinement structure. The area of the substrate W wetted by the liquid is generally larger than the surface area of each of the dies exposed. The practical effect of this is that some dies are exposed that comprise at least a portion that has been wetted and dried before. This effect may also arise in the other localized liquid supply systems, such as those described herein. Although steps may be taken to reduce the level of contaminants in the immersion liquid, and to minimize the amount of liquid left behind after the liquid confinement structure has passed, it is likely that some contamination will remain and some immersion liquid will be left on the substrate. Contaminants left behind as the liquid evaporates may cause errors when the target region concerned comes to be exposed to the patterned radiation beam. In addition, overlay and other errors may be caused by cooling caused by evaporation of the residue liquid.

According to an embodiment of the present invention, evaporation of immersion liquid from the substrate may be stemmed while target portions or dies on the substrate are being exposed. In this way, contaminants that may be present in the immersion liquid remain suspended within the liquid during exposure rather than being concentrated at the level of the top surface of the substrate. In other words, the contaminants remain generally out of focus and therefore have a more limited effect on the quality of the image formed on the substrate. Furthermore, heat loss from evaporation during exposure may be reduced (or entirely avoided) because of the reduction (or complete prevention) of evaporation during this period. This may reduce imaging errors caused by contaminants on the substrate surface as well as those caused by thermal shrinkage without necessarily having to resort to complex and expensive methods of reducing the level of contamination in the immersion liquid (which may never be possible to such an extent that the effect of contaminants would be entirely negligible) or arranging for removal of immersion liquid from the substrate as the liquid confinement structure moves past (which again may not be possible without expense and without risking side effects that may be damaging in other ways to the image printed to the substrate)

Figure 5:
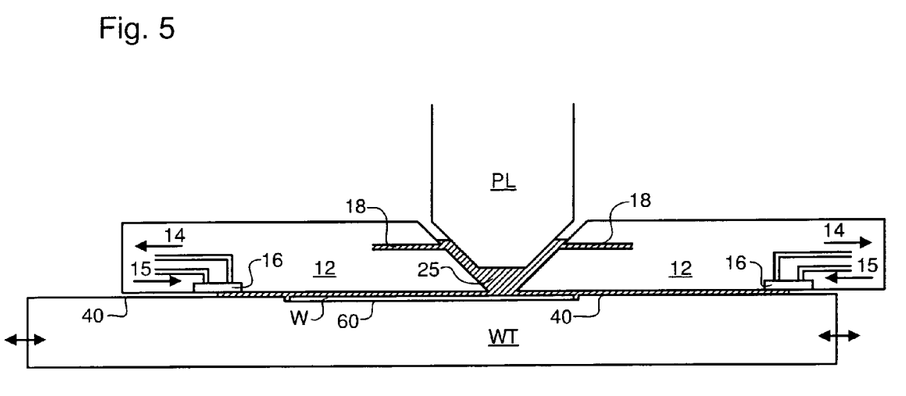
FIG. 5 depicts an extended liquid confinement structure arranged to cooperate with a substrate table comprising a sealing zone according to an embodiment of the invention.

FIG. 5 illustrates an embodiment of the invention wherein a reservoir of immersion liquid 25 is formed by a liquid confinement structure 12 positioned below and surrounding the final element of a projection system PL. Liquid is brought into the space below the projection system and within the liquid confinement structure 12 by a liquid supply system 18. The liquid confinement structure 12 extends a little above the final element of the projection system PL and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

According to this embodiment, the liquid is confined in the reservoir 25 by a gas seal 16 between the bottom of the liquid confinement structure 12 and a sealing zone 40, surrounding a substrate seat 60, defining where a substrate will be held on the substrate table WT during exposure. The sealing zone 40 is arranged to be wide enough that the gas seal 16 is always positioned directly over a portion of it for all positions of the substrate table WT relative to the liquid confinement structure 12 and projection system PL during exposure of the substrate W. Therefore, the interface maintained by the liquid confinement structure 16 between the liquid and the gas surrounding the liquid confinement structure 12 is kept within the sealing zone 40. The gas seal is formed by gas, e.g. air, synthetic air, $N_2$ or an inert gas, provided under pressure via inlet 15 to the gap between liquid confinement structure 12 and substrate W and extracted via outlet 14. The overpressure on the gas inlet 15, vacuum level on the outlet 14 and geometry of the gap are arranged so that there is a high-velocity gas flow inwards that confines the liquid. In an embodiment, the gas seal may simply be the gas outlet 14 drawing liquid and gas from an area surrounding the liquid confinement structure 12.

Figure 6A:
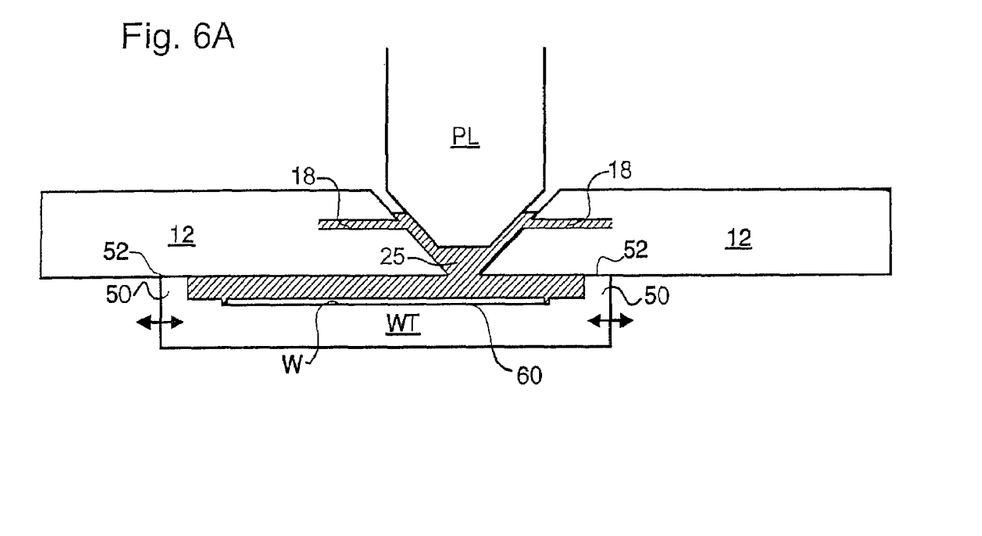
FIG. 6A depicts an extended liquid confinement structure configured to interact with a substrate table comprising a sealing projection according to an embodiment of the invention.
Figure 6B:
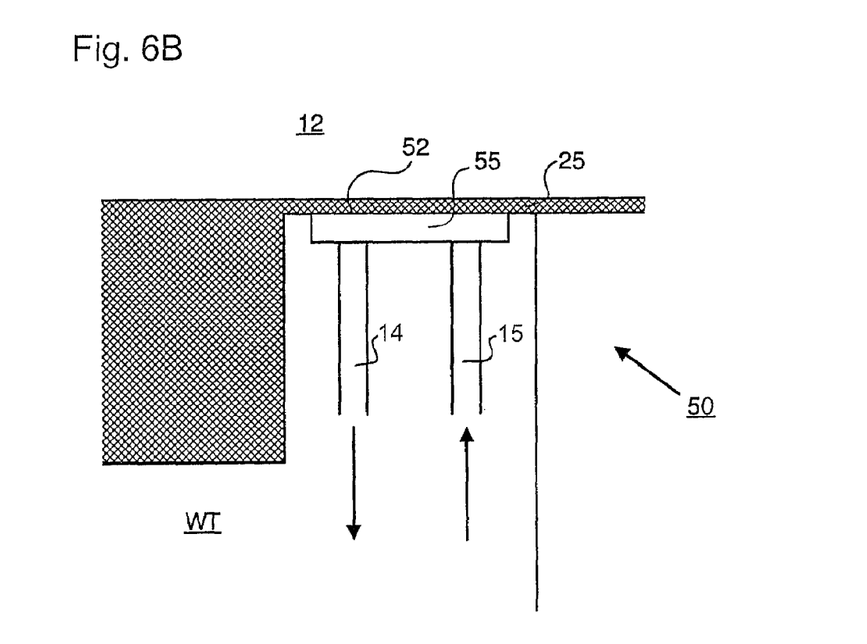
FIG. 6B shows a magnified view of the sealing projection of FIG. 6A in the case where a gas seal is used to contain the immersion liquid.

FIGS. 6A and 6B illustrate an embodiment of the invention that is analogous to that depicted in FIG. 5 but which does not require an extended substrate table WT to accommodate a sealing zone 40 or similar. Instead, the substrate table WT is provided with a sealing projection 50, which is arranged to surround a substrate seat 60. The sealing projection 50 is arranged to contain liquid within a region between the substrate table WT, the liquid confinement structure 12 and a final element of the projection system PL in such a way that substantially the whole substrate W is covered in liquid during exposure of each target area. As before, the substrate table WT can move relative to the liquid confinement structure 12 and the projection system PL with a seal being provided between a lower surface of the liquid confinement structure 12 and the sealing projection 50, for example a contactless seal such as a gas seal as described above, at the tip 52 of the sealing projection 50. FIG. 6B shows an enlarged view of the region around a tip 52 of the sealing projection 50. According to the embodiment shown, the sealing projection 50 comprises a gas seal 55 with a gas inlet 15 and a gas outlet 14, the gas seal 55 being arranged to operate in the same, or analogous, way as the gas seal 16 discussed above with reference to FIG. 5. In an embodiment, the gas seal 55 may simply be the gas outlet 14 drawing liquid and gas from an area surrounding the liquid confinement structure 12 and/or substrate table WT.

An advantage of providing the gas seal 55 as part of the substrate table WT, as depicted in FIGS. 6A and 6B, rather than the liquid confinement structure 12 is that the substrate table WT could be made more compact. On the other hand, an advantage of the embodiment depicted in FIG. 5, where the gas seal is provided in the liquid confinement structure 12, is that the apparatus needed to realize the gas supply and exhaust system associated with the gas seal could be provided more easily in a stationary system such as the liquid confinement structure 12, and with less risk of mechanical or thermal side effects influencing the imaging process, than in a moving system such as the substrate table WT.

Figure 7A:
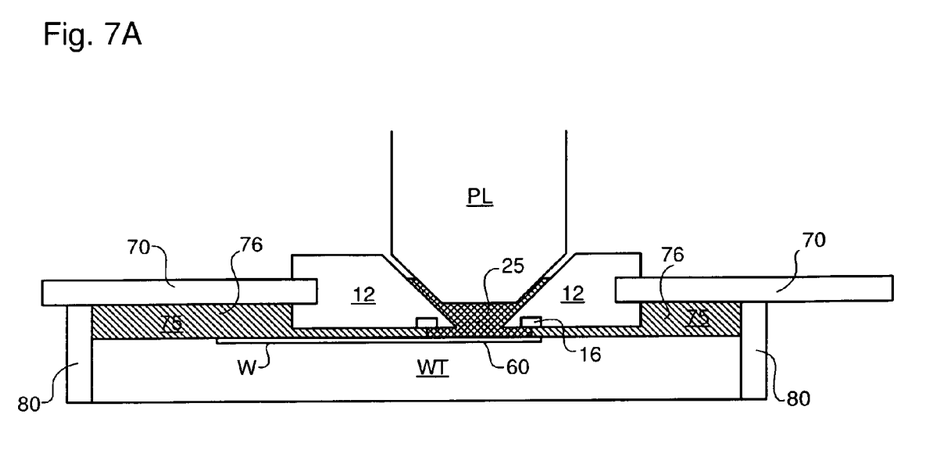
FIGS. 7A and 7B depict a non-extended liquid confinement structure configured to operate in combination with a gas seal extension structure according to an embodiment of the invention.
Figure 7B:
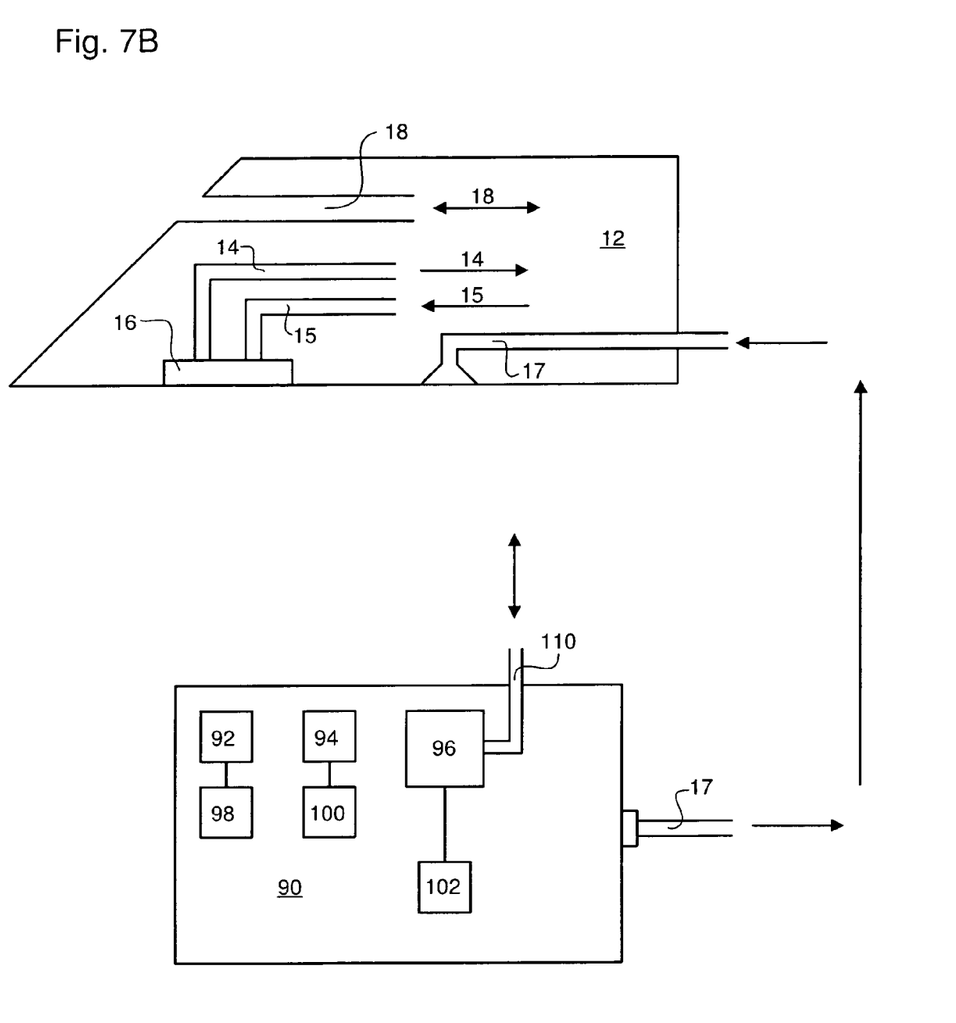

FIGS. 7A and 7B illustrate an embodiment of the invention wherein a region of liquid is maintained between the substrate W and the final element of the projection system PL and is radially constrained by a gas seal 16 in a liquid confinement structure 12. A gaseous region 76 substantially saturated with a vapor 75 of the liquid 25 (or other liquid) is maintained outside of the gas seal 16 in such a way that each target area on the face of the substrate W is immersed either in the liquid 25 or the substantially saturated gas 75 for the whole period from exposure of a first target portion on the substrate W to exposure of the final target portion on substrate W. In order to achieve this effect, the liquid confinement structure 12 is provided with an extension structure 70, which is fixed with respect to the liquid confinement structure 12 and extends radially. The substrate table WT is provided with a vapor sealing projection 80 which surrounds a substrate seat 60 of the substrate table WT. The vapor sealing projection 80 is arranged to cooperate with the extension structure 70 in such a way that the substrate table WT can move with respect to the projection system PL in order to expose different portions of the substrate W while at the same time preventing substantially saturated gas from escaping from the region between the gas seal 16, extension structure 70 and vapor sealing projection 80. FIG. 7B shows a magnified view of a cross section of the liquid confinement structure 12, showing the gas seal 16 with an inlet 15 and an outlet 14 operating according to the principle described above with reference to FIG. 5, and a vapor duct 17, which acts to maintain the substantially saturated gas composition and pressure within a desired range. This may be implemented via a single duct 17 where a flow of substantially saturated gas isn't necessary. In order to control one or more properties of the substantially saturated gas above the substrate W, the duct 17 may be connected to a saturated gas reservoir 90, which may contain one or more components to control one or more properties of the vapor supplied to the region 76, including, for example, a temperature sensor 98 coupled with a temperature controller 92, a pressure sensor 100 coupled with a pressure controller 94, and/or a composition sensor 102 coupled with a composition controller 96. The composition controller 102 may include a liquid vapor source and sink, which may exchange, for example, liquid with the liquid supply system 18 via duct 110. More generally, a saturated gas preparer may be provided to make substantially saturated gas from the immersion liquid using any presently known or future devices and/or methods of creating saturated gas.

According to the arrangement shown, liquid remaining on the substrate W after the liquid confinement structure 12 has passed by will remain in liquid form because of the substantially saturated gas maintained above the substrate W. The lack of evaporation means that substrate shrinkage problems as well as accumulation of contaminants at the substrate surface may be avoided. The vapor sealing projection 80 may operate in an analogous fashion to the sealing projection illustrated in FIGS. 6A and 6B by using a gas seal as described above. The embodiment of FIGS. 7A and 7B has an advantage of reducing the volume of immersion liquid maintained in the region of the substrate W (which may be advantageous, for example, from the point of view of maintaining liquid purity). It also may avoid the situation where the gas seal 16 overlaps the edge of the substrate W where gaps can exist that may disrupt the operation of the gas seal 16 and therefore the stability of the liquid confinement structure 12. In addition, it may be advantageous to avoid having to provide means to cope with liquid seeping into the region behind the substrate W.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, in particular, but not exclusively, to those types mentioned above. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a projection system configured to project a patterned radiation beam onto a target portion of a substrate;
   a substrate table configured to hold the substrate;
   a liquid supply system configured to at least partly fill a region between the substrate and the projection system with a liquid;
   a saturated gas supply system configured to provide substantially saturated gas to a surface of the substrate not covered by liquid; and
   a liquid confinement structure not directly attached to the substrate table and movable in a direction substantially parallel to an optical axis of the projection system, the liquid confinement structure configured to at least partly contain the liquid and comprising an extension structure extending substantially radially, with respect to the optical axis, from the liquid confinement structure to restrict substantially saturated gas to a region above an upper surface of the substrate table.

2. The apparatus according to claim 1, wherein the liquid confinement structure is fixed in a plane substantially perpendicular to the optical axis of the projection system.

3. The apparatus according to claim 1, wherein the extension structure is arranged to cooperate with a vapor sealing projection, forming part of a substrate table configured to hold the substrate, so as to substantially contain the substantially saturated gas.

4. The apparatus according to claim 3, wherein the extension structure and the vapor sealing projection are configured to contain the substantially saturated gas in a region delimited by the substrate table, the substrate, the liquid when provided to the region, the liquid confinement structure, the extension structure and the vapor sealing projection.

5. The apparatus according to claim 3, wherein the vapor sealing projection comprises a gas seal configured to substantially prevent flow of substantially saturated gas through a gap between a surface of the extension structure and the vapor sealing projection.

6. The apparatus according to claim 1, wherein the saturated gas supply system comprises a saturated gas preparer configured to make substantially saturated gas from the liquid.

7. The apparatus according to claim 1, wherein the liquid supply system is configured to supply liquid to a region covering only a localized portion of the substrate at any one time.

8. A lithographic apparatus, comprising:
   a substrate table configured to hold a substrate to be exposed;
   a projection system configured to project a patterned radiation beam onto a target portion on a side of the substrate to be exposed;
   a liquid supply system configured to at least partly fill a region between the substrate and the projection system with a liquid;
   a first confinement structure not directly attached to the substrate table and configured to cooperate with the substrate table in order to restrict the liquid to a region above an upper surface of the substrate table;
   a second confinement structure not directly attached to the substrate table and configured to cooperate with the substrate table in order to restrict substantially saturated gas to a region above an upper surface of the substrate table;
   a seal configured to substantially prevent flow of substantially saturated gas through a gap between a surface of the second confinement structure and the structure table,
   wherein the first and second confinement structures and the substrate table are arranged so that a side of the substrate to be exposed is entirely covered with substantially saturated gas except for an area covered with liquid during exposure.

9. The apparatus according to claim 8, wherein the substrate table comprises a vapor sealing projection arranged to cooperate with the second confinement structure so as to substantially contain the substantially saturated gas.

10. The apparatus according to claim 9, wherein the second confinement structure and the vapor sealing projection are configured to contain the substantially saturated gas in a region delimited by the substrate table, the substrate, the liquid when provided to the region, the first confinement structure, the second confinement structure and the vapor sealing projection.

11. The apparatus according to claim 9, wherein the vapor sealing projection comprises the seal, the seal comprising a gas seal configured to substantially prevent flow of substantially saturated gas through a gap between a surface of the second confinement structure and the vapor sealing projection.

12. The apparatus according to claim 8, wherein the liquid supply system is configured to supply liquid to a region covering only a localized portion of the substrate at any one time.

13. The apparatus according to claim 8, further comprising a saturated gas supply system configured to provide substantially saturated gas to a surface of the substrate not covered by liquid.

14. A lithographic apparatus, comprising:
a substrate table configured to hold a substrate to be exposed;
a projection system configured to project a patterned radiation beam onto a target portion of a substrate;
a liquid supply system configured to at least partly fill a region between the substrate and the projection system with a liquid;
a saturated gas supply system configured to provide substantially saturated gas to a surface of the substrate not covered by liquid;
a first confinement structure fixed in a plane substantially perpendicular to an optical axis of the projection system and configured to at least partly contain the liquid; and
a second confinement structure fixed in a plane substantially perpendicular to an optical axis of the projection system and movable in a direction substantially parallel to the optical axis, the second confinement structure configured to cooperate with the substrate table in order to restrict substantially saturated gas to a region above an upper surface of the substrate table,
wherein the first and second confinement structures and the substrate table are arranged so that a side of the substrate to be exposed is entirely covered with substantially saturated gas except for an area covered with liquid during exposure.

15. The apparatus according to claim 14, wherein the substrate table comprises a vapor sealing projection arranged to cooperate with the second confinement structure so as to substantially contain the substantially saturated gas.

16. The apparatus according to claim 15, wherein the vapor sealing projection comprises a gas seal configured to substantially prevent flow of substantially saturated gas through a gap between a surface of the second confinement structure and the vapor sealing projection.

17. A device manufacturing method, comprising:
at least partly filling a region between a projection system of a lithographic apparatus and a substrate with a liquid;
providing a substantially saturated gas to a surface of the substrate not covered by liquid;
projecting a patterned radiation beam through the liquid onto a target portion of the substrate using the projection system;
at least partly containing the liquid using a movable liquid confinement structure that is fixed in a plane substantially perpendicular to the optical axis; and
restricting the substantially saturated gas to a region above an upper surface of the substrate table using an extension structure of the liquid confinement structure, the extension structure extending substantially radially, with respect to an optical axis of the projection system, from the liquid confinement structure.

18. The method according to claim 17, wherein the liquid confinement structure is fixed in a plane substantially perpendicular to the optical axis of the projection system.

19. The method according to claim 17, comprising substantially containing the substantially saturated gas using the extension structure in cooperation with a vapor sealing projection forming part of a substrate table holding the substrate.

20. The method according to claim 19, comprising containing the substantially saturated gas in a region delimited by the substrate table, the substrate, the liquid when provided to the region, the liquid confinement structure, the extension structure and the vapor sealing projection.

21. The method according to claim 19, comprising substantially preventing flow of substantially saturated gas through a gap between a surface of the extension structure and the vapor sealing projection using a gas seal.

22. The method according to claim 17, further comprising making the substantially saturated gas from the liquid.

23. The method according to claim 17, wherein the liquid covers only a localized portion of the substrate at any one time.

24. A device manufacturing method, comprising:
restricting a liquid to a region above an upper surface of a substrate table of a lithographic apparatus holding a substrate using a first confinement structure that is fixed in a plane substantially perpendicular to an optical axis of a projection system of a lithographic apparatus and arranged to cooperate with the substrate table;
restricting substantially saturated gas to a region above an upper surface of the substrate table using a second confinement structure that is fixed in a plane substantially perpendicular to the optical axis and arranged to cooperate with the substrate table;
substantially preventing flow of the substantially saturated gas by sealing through a gap between a surface of the second confinement structure and the substrate table by using a seal;
projecting a patterned radiation beam through the liquid onto a target portion of the substrate using the projection system,
wherein the first and second confinement structures and the substrate table are arranged so that a side of the substrate to be exposed is entirely covered with the substantially saturated gas except for an area covered in the liquid during exposure.

25. The method according to claim 24, comprising substantially containing the substantially saturated gas using a vapor sealing projection of the substrate table in cooperation with the second confinement structure.

26. The method according to claim 25, comprising substantially containing the substantially saturated gas in a region delimited by the substrate table, the substrate, the liquid when provided to the region, the first confinement structure, the second confinement structure and the vapor sealing projection.

27. The method according to claim 25, comprising substantially preventing flow of the substantially saturated gas through a gap between a surface of the second confinement structure and the vapor sealing projection using the seal, the seal comprising a gas seal.

28. The method according to claim 24, wherein the liquid covers only a localized portion of the substrate at any one time.

29. The method according to claim 24, further comprising providing a substantially saturated gas to a surface of the substrate not covered by liquid.

30. A device manufacturing method, comprising:
restricting a liquid to a region between a projection system of a lithographic apparatus and a substrate held on a substrate table of the lithographic apparatus using a first confinement structure that is not directly attached to the substrate table;
supplying a substantially saturated gas to a surface of the substrate not covered by liquid;
restricting substantially saturated gas to a region above an upper surface of the substrate table using a second confinement structure that is not directly attached to the substrate table and is movable in a direction substantially parallel to the optical axis, the second confinement structure arranged to cooperate with the substrate table; and
projecting a patterned radiation beam through the liquid onto a target portion of the substrate using the projection system,
wherein the first and second confinement structures and the substrate table are arranged so that a side of the substrate to be exposed is entirely covered with the substantially saturated gas except for an area covered in the liquid during exposure.

31. The apparatus according to claim 30, comprising substantially containing the substantially saturated gas using a vapor sealing projection of the substrate table in cooperation with the second confinement structure.

32. The apparatus according to claim 31, comprising substantially preventing flow of substantially saturated gas through a gap between a surface of the second confinement structure and the vapor sealing projection using a gas seal.

* * * * *